US005538922A

United States Patent [19]
Cooper et al.

[11] Patent Number: 5,538,922
[45] Date of Patent: * Jul. 23, 1996

[54] METHOD FOR FORMING CONTACT TO A SEMICONDUCTOR DEVICE

[75] Inventors: Kent J. Cooper; Jung-Hui Lin; Scott S. Roth; Bernard J. Roman; Carlos A. Mazure; Bich-Yen Nguyen; Wayne J. Ray, all of Austin, Tex.

[73] Assignee: Motorola, Inc., Schaumburg, Ill.

[*] Notice: The term of this patent shall not extend beyond the expiration date of Pat. No. 5,219,793.

[21] Appl. No.: 378,990

[22] Filed: Jan. 25, 1995

Related U.S. Application Data

[63] Continuation of Ser. No. 65,284, May 21, 1993, abandoned, which is a continuation of Ser. No. 709,554, Jun. 3, 1991, Pat. No. 5,219,793.

[51] Int. Cl.⁶ .................................................. H01L 21/46
[52] U.S. Cl. .................... 437/195; 437/193; 437/228 S; 437/984
[58] Field of Search .............................. 437/195, 228, 437/947, 981, 241, 193, 978, 228 ES, 984; 148/DIG. 20; 156/653.1, 657.1

[56] References Cited

U.S. PATENT DOCUMENTS

| | | | |
|---|---|---|---|
| 4,789,648 | 12/1988 | Chow et al. | 437/225 |
| 4,844,776 | 7/1989 | Lee et al. | 156/653 |
| 4,866,009 | 9/1989 | Matsuda | 437/203 |
| 4,948,743 | 8/1990 | Ozaki | 437/40 |
| 4,960,732 | 10/1990 | Dixit et al. | 437/192 |
| 4,996,870 | 3/1991 | Barber et al. | 437/228 |
| 4,997,790 | 3/1991 | Woo et al. | 437/195 |
| 5,010,039 | 4/1991 | Ku et al. | 437/228 |
| 5,028,555 | 7/1991 | Haskell | 437/57 |
| 5,037,777 | 8/1991 | Mele et al. | 437/195 |
| 5,063,176 | 11/1991 | Lee et al. | 437/195 |
| 5,219,793 | 6/1993 | Cooper et al. | 437/195 |

FOREIGN PATENT DOCUMENTS

| | | | |
|---|---|---|---|
| 58-042254 | 3/1983 | Japan | 437/982 |
| 326956 | 8/1989 | Japan | 437/190 |

OTHER PUBLICATIONS

Wolf, et al., Silicon Processing, vol. 1, 1986, pp. 547–551.

M. P. Brassington et al., "An Advanced Submicron Bicmos Technology for VLSI Applications", May 10–13, 1988 SYMPOSIUM ON VLSI TECHNOLOGY, pp. 89–90.

Carter Kaanta et al., "Submicron Wiring Technology With Tungsten And Planarization", Jun. 13–14, 1988, V–MIC CONFERENCE (IEEE).

"Self–Aligned Bitline Contact for 4Mbit DRAM," by K. H. Kuesters et al., ULSI Science and Technology/1897, vol. 87–11, May 1987, pp. 640–649.

"A Self–Aligned Contact Process with Improved Surface Planarization," by K. H. Kusters et al., Journal de Physique, Conference C4, Suppl. No. 9, vol. 49, Sep. 1988, pp. 503–506.

Primary Examiner—T. N. Quach
Attorney, Agent, or Firm—Kent J. Cooper

[57] ABSTRACT

A contact is formed in a semiconductor device (10), independent of underlying topography or pitch. In one method of the present invention, an insulating layer (18) is deposited over a semiconductor substrate (12). An etch stop layer (20) is deposited over the insulating layer. A frame structure (22) is formed on the etch stop material and defines at least one contact region (23 and/or 25) within which the etch stop material is exposed. The exposed portions of the etch stop material are removed from the contact region to expose a portion of the insulating layer. The exposed portion of the insulating layer is then anisotropically etched and at least one contact (30 and/or 32) is formed in the contact region. Depending on where the contact region is positioned, either a self-aligned contact or a non-self-aligned contact may be formed, or both types of contacts may be formed simultaneously.

62 Claims, 5 Drawing Sheets

METHOD FOR FORMING CONTACT TO A SEMICONDUCTOR DEVICE

This application is a continuation of prior application Ser. No. 08/065,284, filed May 21, 1993, abandoned, which is a divisional of application Ser. No. 07/709,554, filed June 3, 1991, U.S. Pat. No. 5,219,793.

CROSS-REFERENCE TO RELATED APPLICATIONS

The present application is related to the following two commonly assigned, co-pending patent applications:

1) "METHOD FOR FORMING A MULTI-LAYER SEMICONDUCTOR DEVICE USING SELECTIVE PLANARIZATION," by Mele et al., Serial No. 07/546,801, filed on Jul. 2, 1990, now U.S. Pat. No. 5,037,777, issued on Aug. 6, 1991.

2) "PROCESS FOR FORMING A CONTACT STRUCTURE," by Cooper et al., Ser. No. 07/618,204, filed on Nov. 26, 1990 as a continuation-in-part of the commonly assigned U.S. Pat. No. 4,997,790 by Woo et al., entitled, "PROCESS FOR FORMING A SELF-ALIGNED CONTACT STRUCTURE."

FIELD OF THE INVENTION

The present invention relates to semiconductor devices in general, and more specifically to methods for forming a self-aligned contact in a semiconductor device and semiconductor devices having self-aligned contacts.

BACKGROUND OF THE INVENTION

Semiconductor manufacturers must continually improve the power and performance of semiconductor devices while keeping the device size to a minimum. In an effort to maintain a small device size, most semiconductor manufacturers reduce individual components of the device to minimal dimensions. Further, manufacturers are vertically integrating more and more of these components, as opposed to using only horizontal integration, to reduce the device area consumed by the components. Vertical integration is typically achieved by using several conductive layers in the device and interconnecting these layers using, for example, interlevel contacts.

As individual component dimensions become smaller, it becomes more difficult to interconnect the various conductive layers. Attributing to the difficulty is the inability to resolve very small dimensions without having to invest in the best optical lithography equipment available. As in any industry, it is advantageous from a cost point of view to get the most performance out of currently owned equipment rather than having to continually and frequently upgrade to new equipment. A problem with using existing lithography equipment in semiconductor manufacturing is difficultly in properly aligning a contact and forming a contact opening in a very small region. A popular approach in the industry to form contacts in small regions is to use self-aligned contact structures. Self-aligned contact structures permit contacts to be made in spaces which are smaller than the space actually printed by optical lithography techniques. For example, a 0.5 µm contact can be formed in a device even though the resolution of a particular piece of optical lithography equipment is 0.8 µm. Furthermore, a self-aligned contact has more lenient alignment tolerances, meaning that a misaligned printed contact opening may still be sufficient to permit reliable contact. One disadvantage is that most self-aligned contact structures rely on underlying topography, such as underlying conductive lines, to define the contact area. The distance between adjacent conductive lines and the thickness of insulating materials overlying these lines govern the dimensions of self-aligned contacts. Because of this dependency, many self-aligned contact structures are termed "pitch dependent," where pitch refers to the distance from the center of one conductive line to another. Furthermore, many existing self-aligned contact processes cannot be used to form contacts in isolated regions of a semiconductor device in which little or no underlying topography exists. Therefore, forming contacts in isolated regions usually requires a non-self-aligned contact formation which typically cannot occur at the same time a self-aligned contact is formed. Devices employing both self-aligned and non-self-aligned contacts at approximately the same level in a device must undergo a sequence of contact formations which undesirably increases fabrication time and fabrication cost.

Therefore, a need exists for an improved method for forming a contact in a semiconductor device, and more specifically for a method which forms pitch-independent contacts and has the ability to form both self-aligned and non-self-aligned contacts simultaneously.

SUMMARY OF THE INVENTION

The present invention permits both self-aligned and non-self-aligned contacts to be formed simultaneously, without having to rely upon pitch of underlying topography. In one form of the invention, a contact is formed by providing a semiconductor substrate. An insulating layer is deposited over the semiconductor substrate. An etch stop layer of a first material is deposited over the insulating layer. A frame structure is formed over the insulating and etch stop layers and defines a contact region. The frame structure is of a second material and has the ability to be etched selectively to the first material. The first material is removed from the contact region to expose a portion of the insulating layer. The exposed portion of the insulating layer within the contact region is anisotropically etched and a contact is formed in the contact region.

These and other features, and advantages, will be more clearly understood from the following detailed description taken in conjunction with the accompanying drawings.

DETAILED DESCRIPTION OF A PREFERRED EMBODIMENT

As indicated above, forming a contact in a semiconductor device is becoming increasingly difficult with components of smaller and smaller dimensions and with multiple conductive layers. Some of the problems associated with forming contacts include reduced lithography alignment tolerances for non-self-aligned contact formation and reliance on underlying topography for self-aligned contacts. Yet another problem with forming contacts is ensuring isolation of the contact from underlying conductive layers. During formation of a contact opening, it is critical not to expose conductive layers which should be electrically isolated from the contact.

The present invention addresses each of these problems and, in addition, can be implemented in forming non-self-aligned contacts and in forming contacts after metal layers have been deposited. Although some semiconductor manufacturers are using self-aligned contacts to overcome problems associated with alignment, a large number of semiconductor devices require a contact to be formed in an isolated, or peripheral, region of the device. In isolated regions, there is often no underlying topography with which to aid in self-aligning a contact. The present invention has an advantage in that it can be used to form both self-aligned and non-selfaligned, or isolated, contacts simultaneously with the same process.

A second advantage is that the present invention is compatible with both high and low temperatures, and therefore can be used to form contacts in both front-end and back-end device fabrication. Front-end fabrication generally refers to process steps which occur prior to, and including, metal deposition. Temperatures in front-end processing may reach as high as 1,050° C. Back-end processing includes fabrication steps after metal deposition. Back-end temperatures are usually restricted to temperatures below 450° C. Temperatures much above 450° C. will melt metal layers, such as aluminum, and therefore cannot be used. Many existing contact formation problems are limited to use in either front-end or back-end fabrication. The present invention does not have this limitation and can be used at anytime in the device fabrication process flow.

Figure 1:
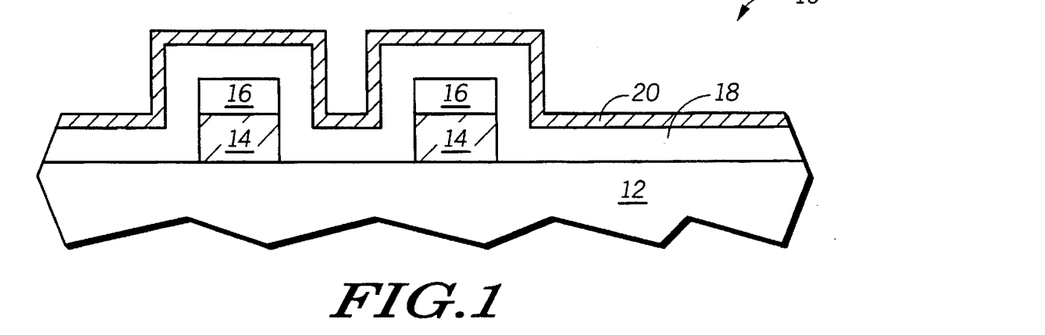
FIGS. 1–11 are cross-sectional illustrations of a portion of a semiconductor device which depict a method for forming both a self-aligned and a non-self-aligned contact in the semiconductor device.

As illustrated in FIGS. 1–11, cross-sectional views of a semiconductor device 10 demonstrate a method for forming a contact in accordance with the present invention. A substrate 12 is provided, the substrate having two spaced apart conductive members 14 formed thereon as illustrated in FIG. 1. Substrate 12 will most often be a bulk semiconducting material of the device, such as silicon, gallium arsenide, or the like. Alternatively, substrate 12 may be an intermediate layer with device 10, for example an interlevel conductive layer or perhaps an interlevel dielectric layer. Conductive members 14 overlying substrate 12 may be separated from the substrate by an intervening layer (not shown) such as an oxide or other dielectric. Conductive members 14 may be of any conducting material used in semiconductor device fabrication including, but not limited to, polysilicon, aluminum, copper, and alloys thereof. Above each of the conductive members 14 is a dielectric layer 16. Dielectric layer 16 is provided in order to ensure that conductive members 14 do not become exposed during formation of a contact opening (not shown in FIG. 1). Any dielectric material is suitable as the dielectric layer, for example tetra-ethyl-ortho-silicate (TEOS) or silicon nitride ($Si_3N_4$). A conductive material and the dielectric layer may be deposited over substrate 12 sequentially and then patterned to simultaneously form conductive members 14 with overlying dielectric layer 16. In doing so, only one masking step is required.

As FIG. 1 also illustrates, an insulating layer 18 is formed over substrate 12 and conductive members 14. Insulating layer 18 is preferably conformal in order to have more desirable etch properties, as will be apparent below. Insulating layer 18 can be an oxide, glass, TEOS, or the like. Overlying insulating layer 18 is an etch stop layer 20. Like the insulating layer, etch stop layer 20 is preferably a conformal layer to enhance etch profiles. Conformal etch stop layers can be easily deposited using, for example, chemical vapor deposition (CVD). Etch stop layer 20 may be either conductive or nonconductive, but is preferably polysilicon. Other suitable materials for etch stop layer 20 are tungsten and $Si_3N_4$, among others. In FIGS. 1–11, etch stop layer 20 is presumed to be a conductor. At the appropriate points in this discussion, the method for treating a non-conductive etch stop layer will be described but will not be illustrated.

Figure 2:
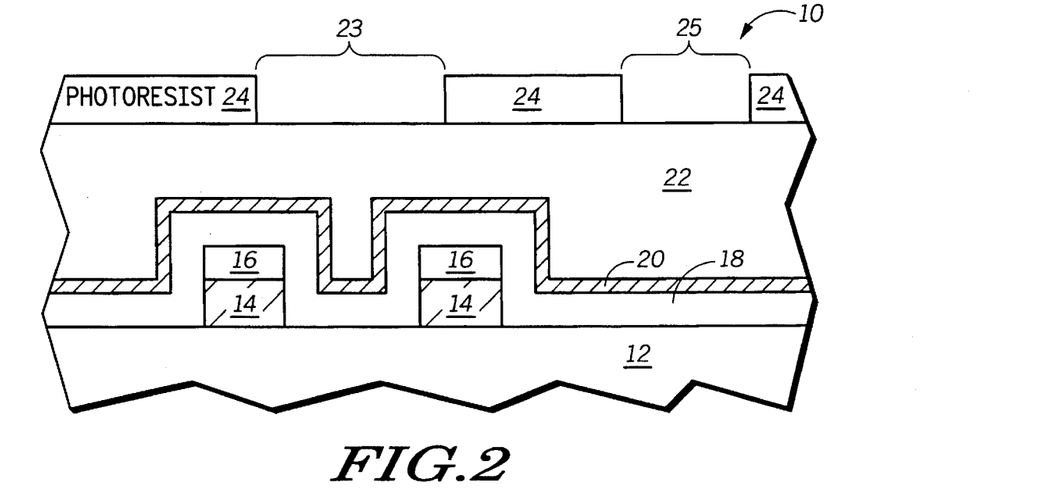

One requirement of etch stop layer 20 is that the layer have the ability to resist an etch which attacks a planarizing layer 22, illustrated in FIG. 2. Planarizing layer 22 is formed over etch stop layer 20 by depositing a spin-on-glass (SOG), phospho-silicate glass (PSG), boron-doped PSG (BPSG), or the like. One may use a planarizing material which is highly doped without adversely affecting the semiconductor device. In the case in which etch stop layer 20 is conductive, planarizing layer 22 will be sacrificial, in other words will be removed later in the fabrication process. If etch stop layer 20 is nonconductive, planarizing layer 22 need not be removed. Accordingly, the choice of planarizing material should be chosen with these alternatives in mind. Also, in order to use a process in accordance with the present invention in both front-end and back-end operations of semiconductor device manufacturing, it is advantageous to choose a material for use as planarizing layer 22 which is compatible with temperatures in excess of 450° C. Another important note is that while layer 22 is referred to as a "planarizing" layer, it is not essential the layer 22 be planar. In a preferred embodiment, layer 22 is planar to reduce topography of the device, thereby improving lithographic capabilities.

Figure 3:
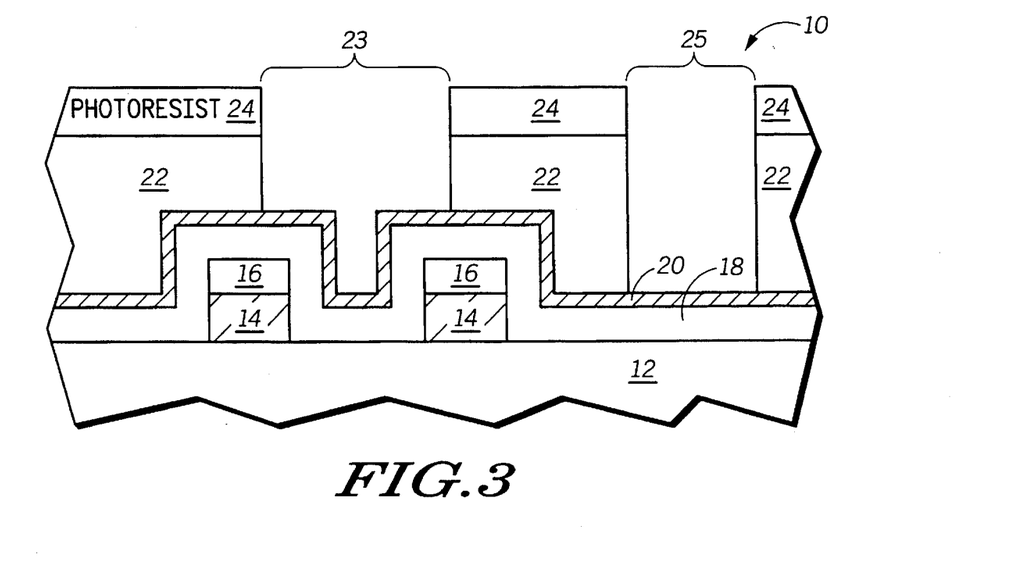

As FIG. 2 also illustrates, semiconductor device 10 is masked with a pattern of photoresist 24. The photoresist pattern, or any other masking pattern, is formed in a conventional manner, for instance by using optical lithography techniques. Photoresist 24 is patterned to form a first opening 23 and a second opening 25. First opening 23 will be used to form a self-aligned contact opening while second opening 25 will help to define a non-self-aligned contact opening, both of which will become evident as the description progresses. As discussed earlier, a process in accordance with the present invention, including the process illustrated in FIGS. 1"11, permits simultaneous formation of self-aligned and non-self-aligned contacts. The simultaneous formation of these two types of contacts is easily seen by referring to first opening 23 and second opening 25 throughout the remaining description and illustrations of an embodiment of the present invention.

Upon masking semiconductor device 10, the device is subjected to an anisotropic etch as illustrated in FIG. 3. The anisotropic etch removes unmasked portions of planarizing layer 22 in essentially one direction, thereby transferring first opening 23 and second opening 25 into the planarizing layer 22. Anisotropic etching is well known in the industry. One of the many ways to perform an anisotropic etch is by using a reactive ion etch (RIE). In choosing the etch parameters used to etch planarizing layer 22 it is not only important to have an anisotropic etch, but it is equally important that the etch chemistry not substantially attack etch stop layer 20. As the name suggests, etch stop layer 20 is used to arrest the anisotropic etch once the planarizing layer 22 has been removed from the first and second openings, 23 and 25 respectively. As an example of a suitable embodiment of the invention, an oxide planarizing layer can be etched selective to a polysilicon etch stop layer with a plasma etch having a gas composition of $CF_4$, $CHF_3$, and Ar (argon) in a volume ratio of 1:10:20 under a pressure in the range of 150–350 mtorr. A magnetic field of less than 25 gauss, in conjunction with the previously mentioned parameters, is suggested. The selectivity of the aforementioned etch recipe is on the order of 30:1. Other etch recipes which use any of the following gases, $CHF_3$, $C_2F_6$, $CHF_3$, Ar, and $O_2$, may also be suitable for anisotropically etching planarizing layer 22 selective to etch stop layer 20. The resulting patterned planarizing layer 22 defines a frame structure, as FIG. 3 illustrates. For the remainder of this discussion the patterned planarizing layer 22 will be referred to as frame structure 22.

Figure 4:
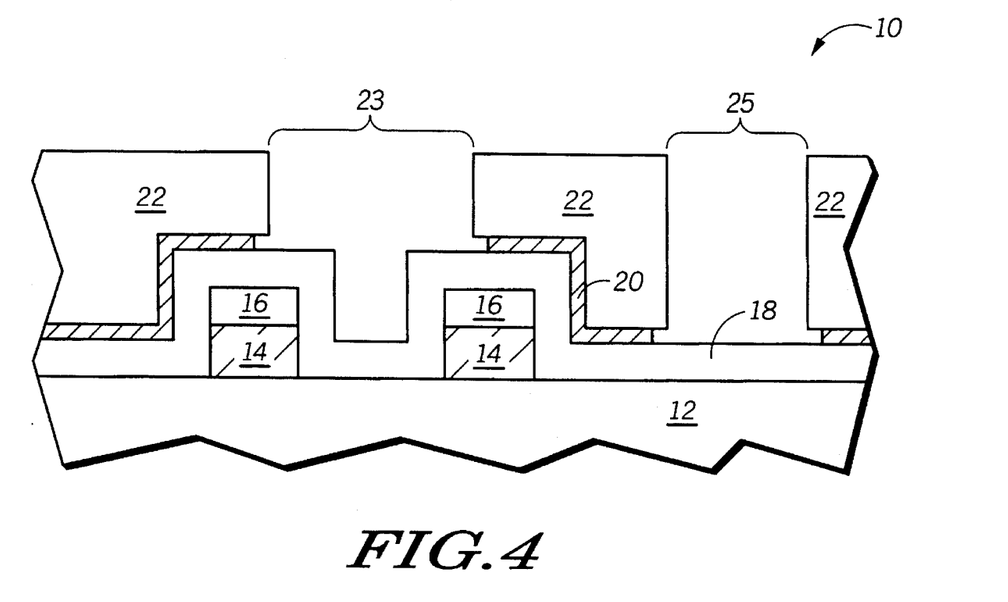

Once frame structure 22 is formed, portions of etch stop layer 20 which are exposed within first opening 23 and second opening 25 are removed, as illustrated in FIG. 4. Removing these selected portions of etch stop layer 20 may be accomplished using an etch chemistry which will attack the etch stop layer material without substantially attacking insulating layer 18. Removal of etch stop 20 may be performed either isotropically or anisotropically. Isotropic removal may result in slight undercutting of the etch stop layer with respect to frame structure 22, as FIG. 4 illustrates. In an embodiment in which polysilicon is used as the etch stop layer, polysilicon can be readily etched selective to numerous oxide layers using conventional etching techniques. As an example, HBr and $Cl_2$ plasma etches, including downstream etches, can be used to selectively remove a polysilicon etch stop layer. Conventional wet polysilicon etches may also be used. As a result of removing portions of etch stop layer 20 within first and second openings, portions of insulating layer 18 become exposed within the openings as indicated in FIG. 4. Photoresist 24 may be removed at this point or may remain on device 10 through subsequent etching processes which utilize openings 23 and 25.

Figure 5:
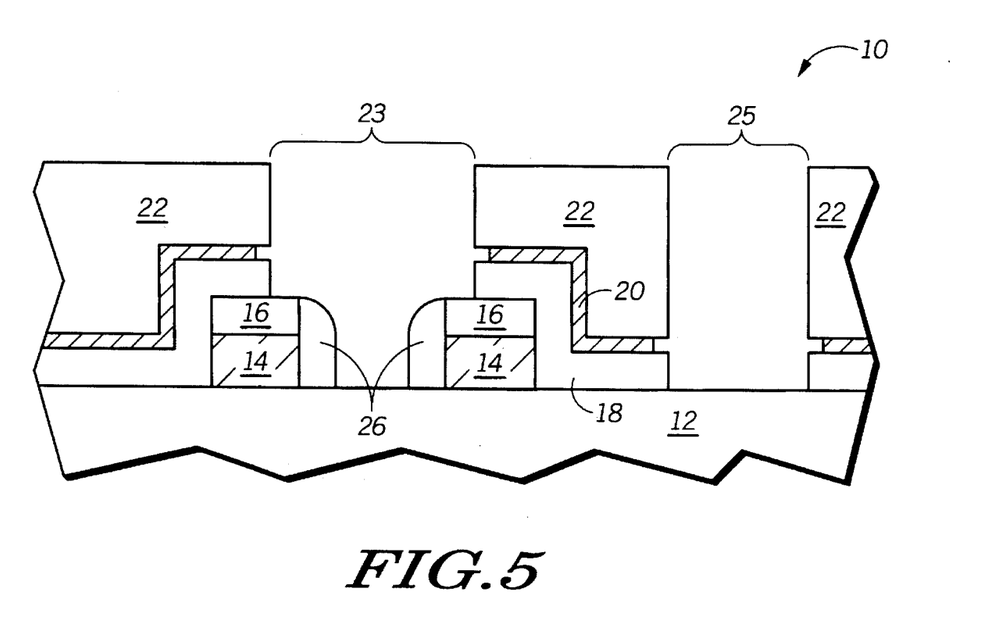

As illustrated in FIG. 5, the portions of insulating layer 18 which are exposed in FIG. 4 undergo an anisotropic etch. The purpose of the anisotropic etch is twofold: first, to expose portions of substrate 12 within first and second openings, 23 and 25 respectively; and second, to form a sidewall spacer 26 along a side of each of the conductive members 14. The anisotropic etch might also attack frame structure 22; however, if the initial planarizing layer is deposited to a sufficient thickness, any attack on frame structure 22 may be considered harmless. Likewise, dielectric layer 16 above conductive members 14 may also be etched slightly during an anisotropic etch of insulating layer 18; however, this too should cause no problem provided conductive members 14 do not become exposed. One reason why it is preferable that insulating layer 18 be conformally deposited is to avoid substantial etching of dielectric layer 16 before exposing portions of substrate 12. Yet another reason for a conformal insulating layer is to enable sidewall spacers 26 to be formed during the anisotropic etch. Sidewall spacers 26, in conjunction with insulating layer 18 and dielectric layer 16, insulate conductive members 14. If insulating layer 18 were not conformal, it would be more difficult to control the formation of the sidewall spacers and the amount of dielectric layer etched. The anisotropic etch used to expose portions of substrate 12 and to form sidewall spacers 26 can be accomplished using existing etch chemistries and techniques, such as utilization of a plasma or RIE etching systems.

Figure 6:
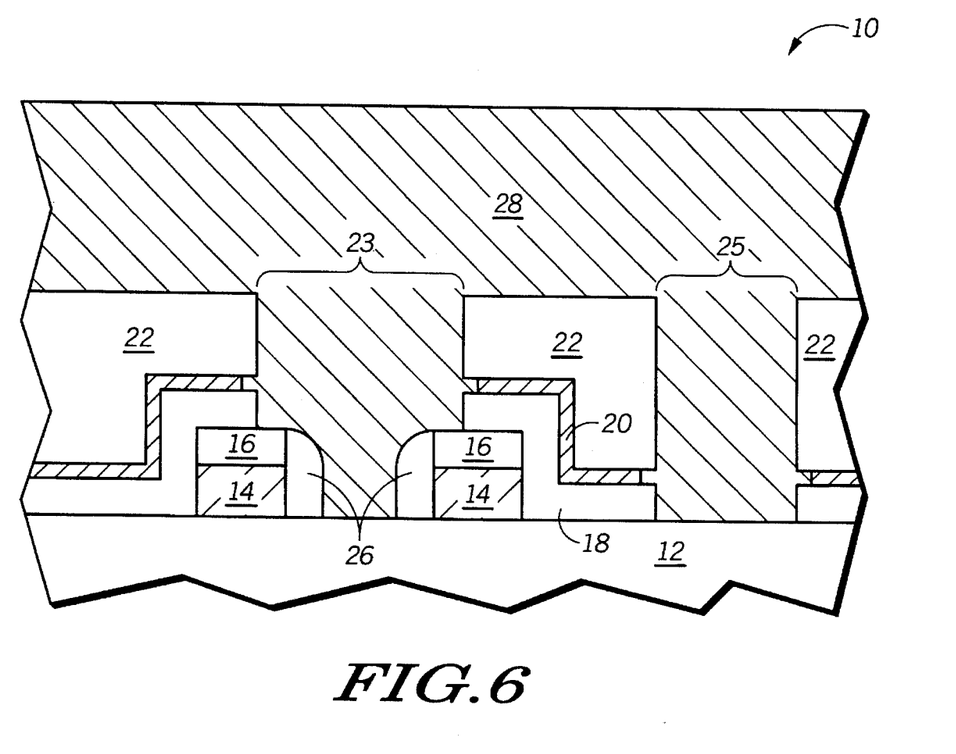

Once portions of substrate 12 are exposed within first opening 23 and second opening 25, a conductive material 28 is deposited over semiconductor device 10, as in FIG. 6. Prior to depositing conductive material 28, photoresist 24 should be removed if still on the device. Conductive material 28 is deposited in a blanket manner such that both openings are filled with the conductive material. A preferred material for conductive material 28 is doped or undoped polysilicon, although other materials, such as aluminum or tungsten, may also be used. If a material other than polysilicon is used, one may wish to first deposit a barrier metal on the exposed portions of substrate 12 in order to establish an acceptable contact resistance and maintain metallurgical integrity in the contact regions. Conductive material 28 should be deposited to a thickness which is sufficient to substantially fill first and second openings 23 and 25, respectively. For example, depositing a conductive material to a thickness which is at least one-half the width of the larger of the two openings will suffice. In doing so, semiconductor device 10 should also become considerably planar as FIG. 6 illustrates.

Figure 7:
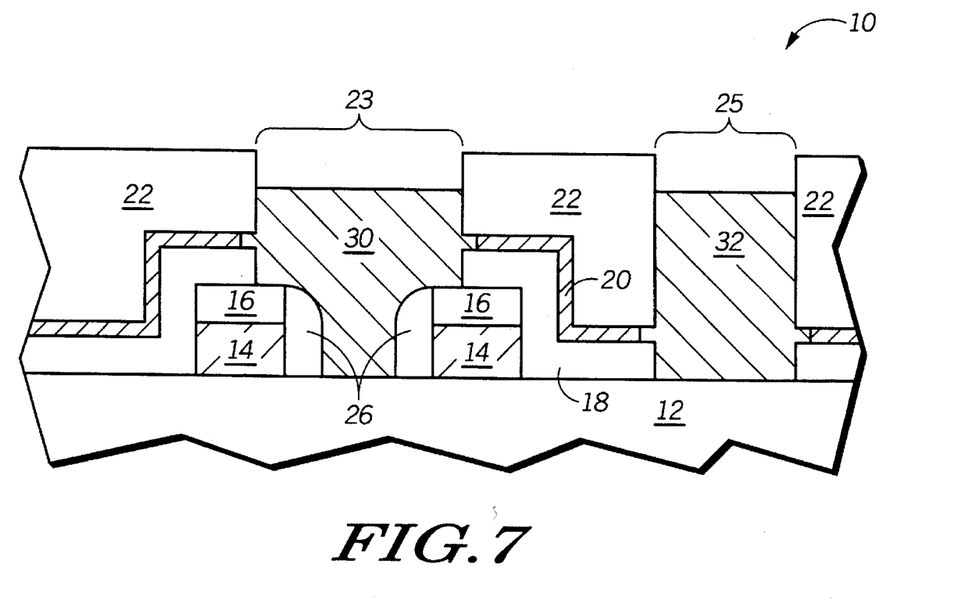

FIG. 7 illustrates that conductive material 28 is etched back to form two plug contacts, specifically a self-aligned contact 30 and a non-self-aligned contact 32. Notice that each of the contacts are somewhat recessed in comparison to frame structure 22. Although not required, forming recessed contacts adds insurance that contacts 30 and 32, or other contacts formed in accordance with the present invention, will not be short-circuited to other contacts. Contact 30 is self-aligned because contact can be made to a specific portion of underlying substrate 12 even if first opening 23 is somewhat misaligned (i.e. is shifted to the left or right). The underlying topography, such as underlying conductive members 14, enable the self-alignment of contact 30. Contact 32, on the other hand, has no underlying topography and is therefore not self-aligned. Thus, the position of second opening 25 precisely determines which portion of semiconductor substrate 12 will be in contact with contact 32. Rather than using a blanket deposition and etch-back of a conductive material to form contacts 30 and 32, the contacts may instead be formed by patterning a blanket layer of conductive material or by selectively depositing a conductive material.

At this point, if etch stop layer 20 is of a non-conductive material, contact formation is complete and semiconductor device 10 may undergo any remaining fabrication steps necessary to complete the device. However, if etch stop layer 20 is conductive, it is necessary to remove all or portions of etch stop layer 20 to prevent the contacts 30 and 32 from being short circuited. FIGS. 8–11 will illustrate remaining processing steps which may be used to remove portions of a conductive etch stop layer 20 and other steps used to fabricate semiconductor device 10.

Figure 8:
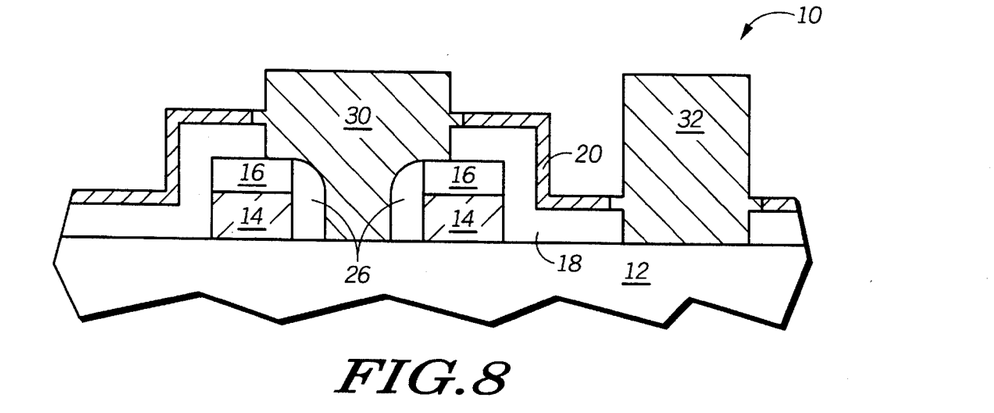

As FIG. 8 illustrates, frame structure 22 is removed from the device, for example, by using an etch chemistry which etches the material used for frame structure 22 selective to etch stop layer 20 and to contacts 30 and 32. As an example, a frame structure which is an oxide can be removed selectively without substantial damage to a polysilicon etch stop layer and polysilicon contacts using a diluted hydrofluoric acid (HF) etch. After removing the frame structure, either all or portions of etch stop layer 20 are removed. In removing all portions of the etch stop layer, semiconductor device 10 is subjected to an etch which is selective to the underlying insulating layer 18. If contacts 30 and 32 are of the same material as etch stop layer 20, for instance polysilicon, the etch will also attack the contacts. However, due to a large thickness differential between the etch stop layer and the contacts, only a small amount of the contact thickness will be etched while the entire etch stop layer is removed. On the other hand, if the contacts are of a material which is different than that of the etch stop layer, the etch chemistry can be chosen to be selective to both underlying insulating layer 18 and contacts 30 and 32. By removing all portions of etch stop layer 20, each contact formed in accordance with the present invention is no longer short-circuited to one another. Any of the etch chemistries used in the art to remove polysilicon without substantial damage to an underlying oxide layer are also suitable for use with the present invention.

Figure 9:
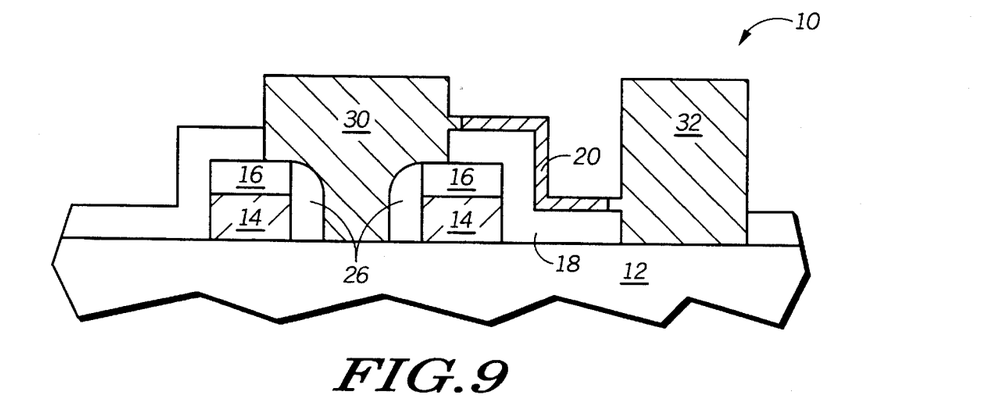

A convenient aspect of the present invention is that rather than completely removing etch stop layer 20, portions of a conductive etch stop layer can be left in semiconductor device 10 to form a local interconnect, as illustrated in FIG. 9. In order to remove only portions of the etch stop layer, a masking sequence will be necessary. A mask (not shown), like the photoresist mask 24 illustrated in FIGS. 2 and 3, may be formed over the portion of etch stop layer 20 illustrated in FIG. 9 and, if desired, over contacts 30 and 32. After masking the device, an etch is used to remove unmasked portions of the etch stop layer while a local interconnect portion of the etch stop layer which adjoins contacts 30 and 32 remains. If contacts 30 and 32 and etch stop layer 20 are each of polysilicon, silicide (not shown) may be formed on the polysilicon, for example by reacting the polysilicon with cobalt or titanium. Silicidation is a technique used within the art to reduce resistivity of electrical interconnects and contacts. In semiconductor device 10 of FIG. 9, silicidation is a self-aligned process and therefore may also be referred to as "salicidation."

Figure 10:
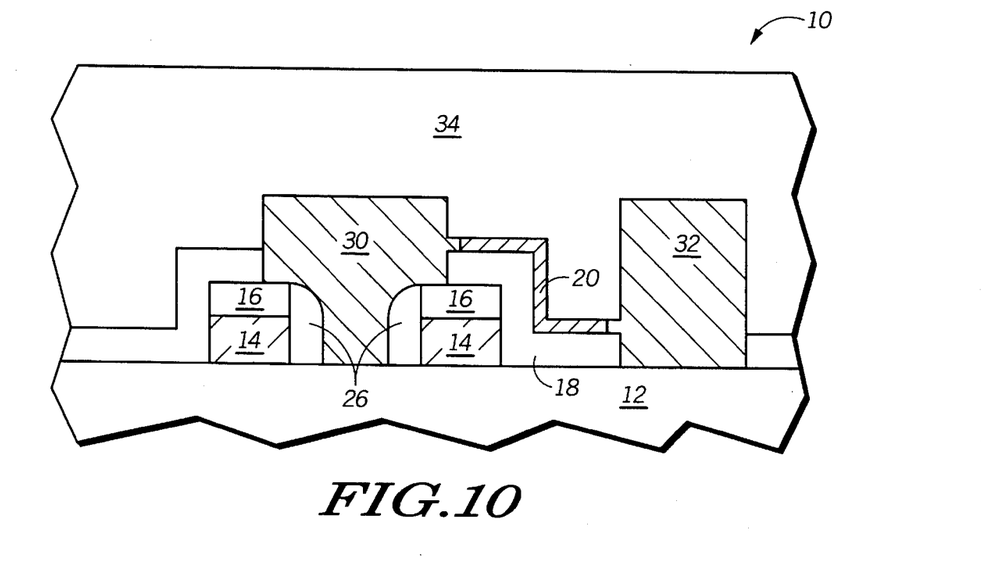
Figure 11:
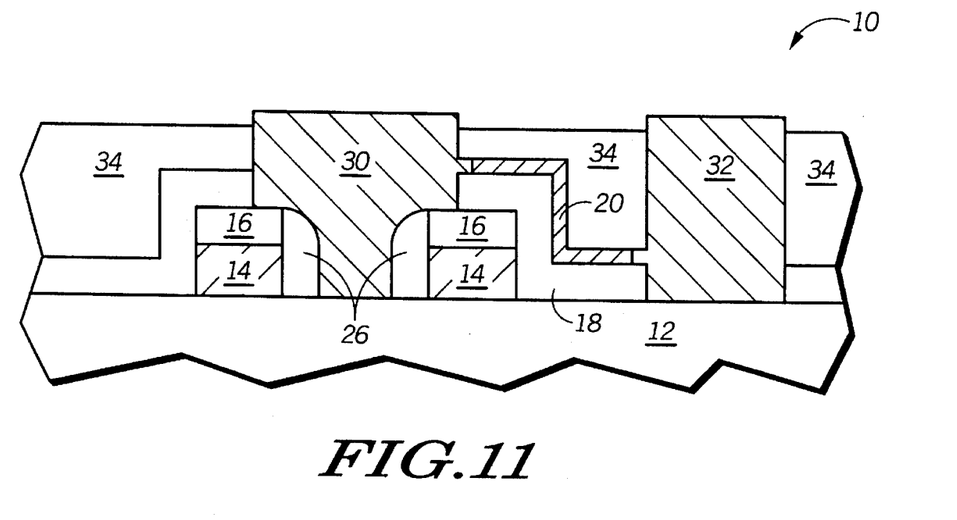

At this point, contacts 30 and 32 formed in accordance with the present invention are complete and the necessary steps to form the contacts have been described and illustrated. To complete fabrication of semiconductor device 10, additional steps such as planarization, metallization, and passivation may be needed. As an example, FIGS. 10 and 11 are provided to illustrate planarization of semiconductor device 10. A planarizing layer 34 is deposited onto the device. Planarizing materials which are typically used in semiconductor device fabrication, such as SOG, PSG, or the like, are suitable for use as planarizing layer 34. As FIG. 11 illustrates, planarizing layer 34 is etched back to a point where contacts 30 and 32 are exposed. Having the contacts exposed permits electrical connection to be made to the contact by, for example, a subsequently deposited metallization layer (not shown). It should be noted that the planarization steps illustrated in FIGS. 10 and 11 are not essential to the present invention, but are provided as a method for producing a planar semiconductor device having the contacts of the present invention formed therein.

Although specific thicknesses of the various layers of semiconductor device 10 are not essential in practicing or understanding the present invention, suitable ranges of layer thicknesses and other dimensions will be given below to more completely demonstrate the present invention. Conductive members 14 are usually formed to a thickness in the range of 150 to 300 nm. The pitch of the conductive members, i.e. the distance from centerline to centerline, may be anywhere from 0.5 to 5.0 µm. However, as discussed earlier, the present invention is pitch independent and can therefore be used anywhere in a semiconductor device. Dielectric layer 16 which overlies the conductive members is on the order of 50 nm thick or greater. While many device manufacturers utilize a similar dielectric layer with thicknesses in excess of 200 nm, the present invention permits much thinner dielectrics if a contact opening is formed using selective etching techniques and if insulating layer 18 is conformal. Etch stop layer 20 can be kept relatively thin, for example between 30 and 100 nm. On the other hand, the planarized frame structure 22 is relatively thick, ranging from approximately 650 to 1200 nm. Similarly, conductive material 28 and planarizing layer 34 are rather thick layers which are deposited to about 600 nm or above. However both conductive material 28 and planarizing layer 34 may be etched back such that the final thicknesses are often much lower. It is important to point out that the thicknesses listed above are exemplary ranges within which the present invention may be carried out. In no way is the invention limited to the above specified dimensions.

Figure 12:
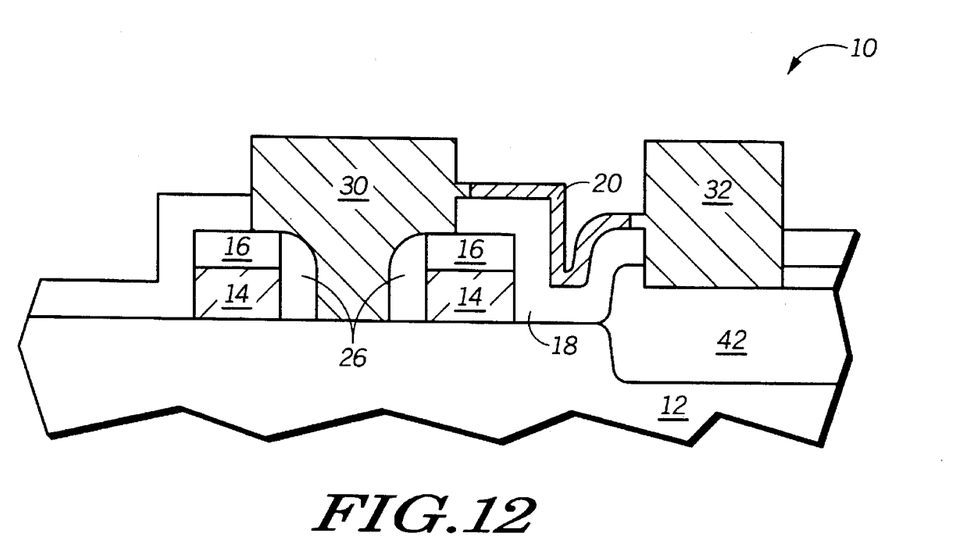
FIG. 12 is a cross-sectional illustration of a portion of a semiconductor device having two contact structures also in accordance with the present invention.

Illustrated in FIG. 12 is another embodiment of the present invention which demonstrates that contacts formed in accordance with the invention need not be formed directly on a bulk semiconductor substrate material. As mentioned previously, contacts may be formed on any layer within a semiconductor device, including insulating layers and conductive layers. FIG. 12 illustrates a semiconductor device 40 having the same elements as described above and referenced with the same reference numerals. However, instead of having both contacts 30 and 32 formed on substrate 12, contact 32 is instead formed on a field oxide region 42. The portion of field oxide region 42 underlying contact 32 is somewhat recessed. The recessed area is formed upon etching an opening in insulating layer 18, since is is difficult to etch an insulating layer, such as an oxide layer, selective to another. The recessed area will not adversely affect the resulting structure. An advantage in forming contact 32 in an isolated portion of the device is that contact 32, along with a conductive local interconnect 20, can be used to electrically access contact 30. One instance in which this technique might be utilized is when contact 30 is relatively small, making it difficult to contact an overlying metallization layer (not shown) to contact 30. In this example, contact 32 can be made large enough to facilitate a metallization contact (not shown) and can function as an intermediate connection between the metallization contact and contact 30.

The foregoing description and illustrations contained herein demonstrate many of the advantages associated with the present invention. In particular, it has been revealed that self-aligned contacts and non-self-aligned contacts can be formed simultaneously in one implementation of the invention. Moreover, the formation of these contacts is completely independent of the pitch of any underlying component or structures. Yet another advantage is that the present invention can be used in both front-end and back-end device processing by utilizing a frame structure material which can withstand the various processing temperatures to which the device is subjected.

Thus it is apparent that there has been provided, in accordance with the invention, a method for forming pitch independent contacts and a semiconductor device having the same that fully meets the advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, it is not required that both a self-aligned and a non-self-aligned contact be formed. One contact, being either self-aligned or non-self-aligned, may be formed in accordance with the present invention. In addition, the invention is not limited to the deposition and etch methods described. As one example, it is not essential that a conductive material be deposited and subsequently etched back in forming contacts in accordance with the invention. Instead, the conductive material may be deposited and subsequently patterned, rather than using a blanket etch. It is also important to note that the present invention is not limited in any way to specific layer thicknesses or other dimensions of the device as mentioned previously. Furthermore, this invention is not limited to those materials specifically described. Although preferred materials have been recited, it is envisioned that numerous materials are suitable for each of the elements of the present invention. Therefore, it is intended that this invention encompass all such variations and modifications as fall within the scope of the appended claims.

We claim:

1. A method for forming contact to a semiconductor device, comprising the steps of:

providing a substrate;

forming two conductive members overlying the substrate, the two conductive members having an overlying patterned dielectric layer, the overlying patterned dielectric layer having a sidewall;

depositing a first insulating layer overlying the two conductive members;

forming a conductive etch stop layer overlying the first insulating layer;

forming a second insulating layer overlying the conductive etch stop layer;

forming a patterned photoresist layer overlying the second insulating layer, the patterned photoresist layer defining a contact region;

etching the second insulating layer to form an opening within the second insulating layer, the opening exposing a portion of the conductive etch stop layer underlying the contact region;

etching the exposed portion of the conductive etch stop layer to expose a portion of the first insulating layer;

anisotropically etching the exposed portion of the first insulating layer to expose a portion of the overlying patterned dielectric layer; and forming a contact in the contact region, wherein the contact is electrically shorted to the conductive etch stop layer.

2. The method of claim 1, wherein the step of forming the second insulating layer comprises:

forming a planar insulating layer.

3. The method of claim 1, wherein the step of forming the two conductive members comprises:

forming two polysilicon members.

4. The method of claim 1, wherein the step of forming the conductive etch stop layer comprises: forming a tungsten layer.

5. The method of claim 1, wherein the step of forming the conductive etch stop layer comprises:

forming a polysilicon layer.

6. The method of claim 1, wherein the step of forming the conductive etch stop layer comprises:

forming a layer of titanium nitride.

7. The method of claim 1, wherein the step of etching the second insulating layer comprises:

etching the second insulating layer using a plasma etch that employs $C_2F_6$ as an etch gas.

8. The method of claim 1, wherein the step of forming the two conductive members further comprises the steps of:

forming a conductive layer;

depositing a dielectric layer overlying the conductive layer;

patterning the dielectric layer to form the overlying patterned dielectric layer; and patterning the conductive layer, wherein both the dielectric layer and the conductive layer are patterned in a single masking step.

9. A method for forming contact to a semiconductor device, comprising the steps of:

providing a semiconductor substrate;

depositing a first insulating layer overlying the semiconductor substrate;

forming a conductive etch stop layer overlying the first insulating layer;

forming a second insulating layer overlying the conductive etch stop layer;

forming a patterned photoresist layer overlying the second insulating layer, the patterned photoresist layer defining a contact region;

etching the second insulating layer to form a first opening within the second insulating layer, the first opening exposing a portion of the conductive etch stop layer underlying the contact region; etching the exposed portion of the conductive etch stop layer to expose a portion of the first insulating layer;

anisotropically etching the exposed portion of the first insulating layer to form a second opening in the first insulating layer, wherein the second opening is smaller than the first opening; and forming a contact in the contact region, wherein the contact is electrically shorted to the conductive etch stop layer.

10. The method of claim 9, wherein the step of forming the second insulating layer comprises:

forming a planar insulating layer.

11. The method of claim 9, wherein the step of forming the conductive etch stop layer comprises:

forming a polysilicon layer.

12. The method of claim 9, wherein the step of forming the contact comprises:

depositing a barrier metal.

13. The method of claim 12, wherein the step of forming the contact further comprises:

depositing a tungsten layer.

14. The method of claim 13, wherein the step of forming the contact further comprises:

removing a portion of the tungsten layer to form a tungsten plug.

15. The method of claim 9, wherein the step of forming the contact comprises:

depositing a polysilicon layer.

16. The method of claim 15, wherein the step of forming the contact further comprises:

removing a portion of the polysilicon layer to form a polysilicon plug.

17. The method of claim 9, wherein the step of forming the contact comprises:

depositing an aluminum layer.

18. The method of claim 1, wherein the step of anisotropically etching the exposed portion of the first insulating layer is further characterized as anisotropically etching the exposed portion of the first insulating layer to form a sidewall spacer abutting the sidewall of the overlying patterned dielectric layer.

19. The method of claim 1, wherein the step of forming the contact comprises:

depositing a barrier metal.

20. The method of claim 19, wherein the step of forming the contact further comprises:

depositing a tungsten layer.

21. The method of claim 20, wherein the step of forming the contact further comprises:

removing a portion of the tungsten layer to form a tungsten plug.

22. The method of claim 1, wherein the step of forming the contact comprises:

depositing a polysilicon layer.

23. The method of claim 22, wherein the step of forming the contact further comprises:

removing a portion of the polysilicon layer to form a polysilicon plug.

24. The method of claim 1, wherein the step of forming the contact comprises:

depositing an aluminum layer.

25. A method for forming contact to a semiconductor device, comprising the steps of:

providing a substrate;

forming two conductive members overlying the substrate, the two conductive members having an overlying patterned dielectric layer, the overlying patterned dielectric layer having a sidewall;

depositing a first insulating layer overlying the two conductive members;

forming a polysilicon etch stop layer overlying the first insulating layer;

forming a second insulating layer overlying the polysilicon etch stop layer;

forming a patterned photoresist layer overlying the second insulating layer, the patterned photoresist layer defining a contact region;

etching the second insulating layer to form an opening within the second insulating layer, the opening exposing a portion of the polysilicon etch stop layer underlying the contact region;

etching the exposed portion of the polysilicon etch stop layer to expose a portion of the first insulating layer;

anisotropically etching the exposed portion of the first insulating layer to expose a portion of the overlying patterned dielectric layer; and forming a contact in the contact region, wherein the contact is electrically shorted to the polysilicon etch stop layer.

26. The method of claim 25, wherein the step of forming the second insulating layer comprises:

forming a planar insulating layer.

27. The method of claim 25, wherein the step of forming the two conductive members comprises:

forming two polysilicon members.

28. The method of claim 25, wherein the step of forming the two conductive members further comprises the steps of:

forming a conductive layer;

depositing a dielectric layer overlying the conductive layer;

patterning the dielectric layer to form the overlying patterned dielectric layer; and patterning the conductive layer, wherein both the dielectric layer and the conductive layer are patterned in a single masking step.

29. The method of claim 25, wherein the step of anisotropically etching the exposed portion of the first insulating layer is further characterized as anisotropically etching the exposed portion of the first insulating layer to form a sidewall spacer abutting the sidewall of the overlying patterned dielectric layer.

30. The method of claim 25, wherein the step of forming the contact comprises:

depositing a barrier metal.

31. The method of claim 30, wherein the step of forming the contact further comprises:

depositing a tungsten layer.

32. The method of claim 31, wherein the step of forming the contact further comprises:

removing a portion of the tungsten layer to form a tungsten plug.

33. The method of claim 25, wherein the step of forming the contact comprises:

depositing a polysilicon layer.

34. The method of claim 33, wherein the step of forming the contact further comprises:

removing a portion of the polysilicon layer to form a polysilicon plug.

35. The method of claim 25, wherein the step of forming the contact comprises:

depositing an aluminum layer.

36. A method for forming contact to a semiconductor device, comprising the steps of:

providing a substrate;

depositing a first insulating layer overlying the substrate;

forming a conductive etch stop layer overlying the first insulating layer;

forming a second insulating layer overlying the conductive etch stop layer;

forming a patterned photoresist layer overlying the second insulating layer, the patterned photoresist layer defining a first contact region and a second contact region;

etching the second insulating layer to form a first opening and a second opening within the second insulating layer, the first opening exposing a first portion of the conductive etch stop layer that underlies the first contact region, and the second opening exposing a second portion of the conductive etch stop layer that underlies the second contact region, wherein the first portion of the conductive etch stop layer is vertically offset from the second portion of the conductive etch stop layer;

removing the exposed first and second portions of the conductive etch stop layer to expose a portion of the first insulating layer;

etching the exposed portion of the first insulating layer; and forming a first contact plug in the first contact region and a second contact plug in the second contact region, the first contact plug having a first contact depth and the second contact plug having a second contact depth, wherein the first contact depth is greater than the second contact depth and at least a portion of the first contact plug is electrically shorted to the conductive etch stop layer and at least a portion of the second contact plug is electrically shorted to the conductive etch stop layer.

37. The method of claim 36, wherein the step of forming the first contact plug and the second contact plug is further characterized as using a third portion of the conductive etch stop layer to electrically short the first contact plug to the second contact plug.

38. The method of claim 36, wherein the step of forming the conductive etch stop layer comprises:

forming a polysilicon layer.

39. The method of claim 36, wherein the step of forming the conductive etch stop layer comprises:

depositing a tungsten layer.

40. The method of claim 36, wherein the step of forming the conductive etch stop layer comprises: forming a titanium nitride layer.

41. The method of claim 36, wherein the step of forming the first contact plug and the second contact plug comprises:
   depositing a barrier metal.

42. The method of claim 41, wherein the step of forming the first contact plug and the second contact plug further comprises:
   depositing a tungsten layer.

43. The method of claim 42, wherein the step of forming the first contact plug and the second contact plug further comprises:
   removing a portion of the tungsten layer to form a first tungsten plug within the first contact region and a second tungsten plug within the second contact region.

44. The method of claim 36, wherein the step of forming the first contact plug and the second contact plug comprises:
   depositing a polysilicon layer.

45. The method of claim 44, wherein the step of forming the first contact plug and the second contact plug further comprises:
   removing a portion of the polysilicon layer to form a first polysilicon plug within the first contact region and a second polysilicon plug within the second contact region.

46. The method of claim 36, wherein the step of forming the first contact plug and the second contact plug is further characterized as forming the second contact plug overlying a field oxide region.

47. The method of claim 36, wherein the step of etching the exposed portion of the first insulating layer is further characterized as etching the exposed portion of the first insulating layer to form a sidewall spacer adjacent to a conductive member.

48. The method of claim 36, wherein the step of forming the first contact plug and the second contact plug is further characterized as forming the first contact plug adjacent to the second contact plug.

49. The method of claim 36, wherein the step of etching the second insulating layer comprises:
   etching the second insulating layer using a plasma etch that employs $C_2F_6$ as an etch gas.

50. A method for forming contact to a semiconductor device, comprising the steps of:
   providing a substrate;
   depositing a first insulating layer overlying the substrate;
   forming a conductive etch stop layer overlying the first insulating layer;
   forming a second insulating layer overlying the conductive etch stop layer;
   forming a patterned photoresist layer overlying the second insulating layer, the patterned photoresist layer defining a first contact region and a second contact region;
   etching the second insulating layer to form a first opening and a second opening within the second insulating layer, the first opening exposing a first portion of the conductive etch stop layer that underlies the first contact region, and the second opening exposing a second portion of the conductive etch stop layer that underlies the second contact region;
   etching the exposed first and second portions of the conductive etch stop layer to expose a portion of the first insulating layer;
   etching the exposed portion of the first insulating layer; and forming a first contact plug in the first contact region and a second contact plug in the second contact region, the first contact plug having a first contact depth and the second contact plug having a second contact depth, wherein the first contact depth is greater than the second contact depth and at least a portion of the first contact plug is electrically shorted to the conductive etch stop layer and at least a portion of the second contact plug is electrically to the conductive etch stop layer.

51. The method of claim 50, wherein the step of forming the first contact plug and the second contact plug is further characterized as using a third portion of the conductive etch stop layer to electrically short the first contact plug to the second contact plug.

52. The method of claim 50, wherein the step of forming the conductive etch stop layer comprises:
   forming a polysilicon layer.

53. The method of claim 50, wherein the step of forming the conductive etch stop layer comprises:
   depositing a tungsten layer.

54. The method of claim 50, wherein the step of forming the conductive etch stop layer comprises:
   depositing a titanium nitride layer.

55. The method of claim 50, wherein the step of forming the first contact plug and the second contact plug comprises:
   depositing a barrier metal.

56. The method of claim 55, wherein the step of forming the first contact plug and the second contact plug further comprises:
   depositing a tungsten layer.

57. The method of claim 56, wherein the step of forming the first contact plug and the second contact plug further comprises:
   removing a portion of the tungsten layer to form a first tungsten plug within the first contact region and a second tungsten plug within the second contact region.

58. The method of claim 50, wherein the step of forming the first contact plug and the second contact plug comprises:
   depositing a polysilicon layer.

59. The method of claim 58, wherein the step of forming the first contact plug and the second contact plug further comprises:
   removing a portion of the polysilicon layer to form a first polysilicon plug within the first contact region and a second polysilicon plug within the second contact region.

60. The method of claim 50, wherein the step of forming the first contact plug and the second contact plug is further characterized as forming the second contact plug overlying a field oxide region.

61. The method of claim 50, wherein the step of etching the exposed portion of the first insulating layer is further characterized as etching the exposed portion of the first insulating layer to form a sidewall spacer adjacent to a conductive member.

62. The method of claim 50, wherein the step of forming the first contact plug and the second contact plug is further characterized as forming the first contact plug adjacent to the second contact plug.

* * * * *